United States Patent
Li et al.

(10) Patent No.: US 10,339,858 B2
(45) Date of Patent: Jul. 2, 2019

(54) PIXEL CIRCUIT, DRIVE METHOD, DISPLAY PANEL AND DISPLAY DEVICE

(71) Applicant: SHANGHAI TIANMA AM-OLED CO., LTD., Shanghai (CN)

(72) Inventors: Yue Li, Shanghai (CN); Gang Liu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 155 days.

(21) Appl. No.: 15/619,554

(22) Filed: Jun. 12, 2017

(65) Prior Publication Data
US 2017/0278455 A1 Sep. 28, 2017

(30) Foreign Application Priority Data
Mar. 1, 2017 (CN) .......................... 2017 1 0117305

(51) Int. Cl.
*G09G 3/3216* (2016.01)
*G09G 3/3233* (2016.01)
(Continued)

(52) U.S. Cl.
CPC .......... *G09G 3/3216* (2013.01); *G09G 3/325* (2013.01); *G09G 3/3233* (2013.01); *H01L 27/28* (2013.01);
(Continued)

(58) Field of Classification Search
CPC .... G09G 3/3216; G09G 3/3233; G09G 3/325; G09G 2320/0257; G09G 2300/0842; H01L 27/32; H01L 27/3248; H01L 27/28
See application file for complete search history.

(56) References Cited

U.S. PATENT DOCUMENTS 9,035,976 B2 5/2015 Lee et al.
9,184,210 B2 * 11/2015 Koyama ................. H01L 27/15
(Continued)

FOREIGN PATENT DOCUMENTS

CN 104064149 A 9/2014
CN 104898887 A 9/2015
(Continued)

OTHER PUBLICATIONS

Transistor, 2006.*
CN First Office Action dated Aug. 3, 2018 in the corresponding on application (application No. 201110117305.4).

*Primary Examiner* — Vinh T Lam
(74) *Attorney, Agent, or Firm* — Kilpatrick Townsend & Stockton LLP (57) ABSTRACT

A pixel circuit, a drive method, a display panel and a display device are provided. A switch transistor is arranged between a first power supply signal and an input terminal (a source) of a drive transistor. When a drive circuit is at a second detection period during which drive current of a light emitting element is detected, the switch transistor is controlled to be turned off, such that the first power supply signal is disconnected from the source of the drive transistor. In this case, no current flows through the light emitting element, and therefore the light emitting element does not emit light, thereby solving a problem in the conventional technology that the light emitting element is lighted and it is not dark in a dark state when drive current of the pixel circuit is detected.

17 Claims, 4 Drawing Sheets

(51) Int. Cl.
*G09G 3/325* (2016.01)
*H01L 27/28* (2006.01)
*H01L 27/32* (2006.01)

(52) U.S. Cl.
CPC .......... *H01L 27/32* (2013.01); *H01L 27/3248* (2013.01); *G09G 2300/0842* (2013.01); *G09G 2310/0251* (2013.01); *G09G 2320/0238* (2013.01); *G09G 2320/0257* (2013.01); *G09G 2320/045* (2013.01); *G09G 2330/12* (2013.01)

(56) References Cited

U.S. PATENT DOCUMENTS

| | | | | |
|---|---|---|---|---|
| 9,208,725 B2* | 12/2015 | Guo | ................... | G09G 3/3258 |
| 9,412,300 B2* | 8/2016 | Wang | ................... | G09G 3/3266 |
| 9,626,905 B2* | 4/2017 | In | ................... | G09G 3/2022 |
| 2013/0135275 A1 | 5/2013 | Okuno et al. | | |
| 2014/0175447 A1* | 6/2014 | Yamashita | ........... | G09G 3/3233 |
| | | | | 257/71 |
| 2015/0364087 A1* | 12/2015 | Gu | ................... | G09G 3/3233 |
| | | | | 345/78 |
| 2016/0307502 A1* | 10/2016 | Nie | ................... | G09G 3/3233 |
| 2017/0052398 A1* | 2/2017 | Yamazaki | ........... | G02F 1/13454 |
| 2017/0110052 A1 | 4/2017 | Kuo | | |
| 2017/0147121 A1 | 5/2017 | Yang et al. | | |
| 2018/0033365 A1* | 2/2018 | Zhang | ................... | G09G 3/3233 |
| 2018/0090071 A1* | 3/2018 | Ma | ................... | H01L 51/5203 |

FOREIGN PATENT DOCUMENTS

| | | | |
|---|---|---|---|
| CN | 105679251 A | 6/2016 | |
| CN | 105845080 A | 8/2016 | |

* cited by examiner

PIXEL CIRCUIT, DRIVE METHOD, DISPLAY PANEL AND DISPLAY DEVICE

CROSS REFERENCE TO RELATED APPLICATION

The present application claims the priority to Chinese Patent Application No. 201710117305.4, titled "PIXEL CIRCUIT, DRIVE METHOD, DISPLAY PANEL AND DISPLAY DEVICE", filed on Mar. 1, 2017 with the State Intellectual Property Office of the People's Republic of China, which is incorporated herein by reference in its entirety.

Field

The present disclosure relates to the technical field of display, and in particular to a pixel circuit, a drive method, a display panel and a display device.

Background

With continuous development of the science and technology, the Organic Light Emitting Diode (OLED) is developed rapidly because of its advantages of high brightness, low drive voltage and energy conservation.

Generally, in an organic light emitting diode display device, a light emitting element (such as an OLED) is driven and controlled by a pixel circuit. In practice, due to the production process and aging of a drive transistor and so on, a threshold voltage Vth of the drive transistor in the pixel circuit drifts, resulting in inconsistent drive current for the light emitting elements. In this case, display brightness is not uniform and picture homogeneity is poor on the display device.

Therefore, in order to solve the above problem, generally the drive current for the pixel circuit needs to be detected and compensated. In practice, it is found that, in order to not influence normal light emitting of the light emitting element when detecting the drive current, generally the drive current is detected when the light emitting element is in a dark state (emitting no light). Presently, when the drive current for the pixel circuit is detected, the light emitting element may be lighted sometimes, so that it is not dark in the dark state.

SUMMARY

In view of above, a pixel circuit, a drive method, a display panel and a display device are provided according to the present disclosure, which solve the problem that a light emitting element is lighted when drive current is detected.

In order to achieve the above objective, technical solutions according to the present disclosure are provided as follows.

A pixel circuit is provided, which includes at least one pixel sub-circuit, the at least one pixel sub-circuit includes a first switch transistor, a second switch transistor, a drive transistor, a storage capacitor and a light emitting element, the first switch transistor is controlled by a first scan signal and is configured to transmit a first data signal to a source of the drive transistor, the second switch transistor is controlled by a second scan signal and is configured to transmit a reference voltage signal to a gate of the drive transistor, the storage capacitor is connected in series between the gate and the source of the drive transistor and is configured to apply a charged voltage as a drive voltage of the drive transistor, the source of the drive transistor is electrically connected to a first power supply signal, and a drain of the drive transistor is connected to an anode of the light emitting element and is configured to transmit drive current from the drive transistor to the anode of the light emitting element, and a cathode of the light emitting element is connected to a second power supply signal and the light emitting element emits light in response to the drive current, and where the pixel circuit further includes a third switch transistor, and the third switch transistor is controlled by a third scan signal and is configured to transmit the first power supply signal to the source of the drive transistor; or the at least one pixel sub-circuit further includes a fourth switch transistor, and the fourth switch transistor is controlled by a fourth scan signal and is configured to transmit the first power supply signal to the source of the drive transistor.

A display panel is provided, which includes:

pixel units arranged in an array;

multiple data lines for providing data signals for the pixel units;

multiple scan lines for providing scan signals for the pixel units; and multiple reference lines for providing reference signals for the pixel units, where each of the pixel units includes the pixel circuit described above;

the scan lines are parallel to a pixel row direction;

the data lines are parallel to a pixel column direction; and in the pixel row direction, two adjacent pixel units of the pixel units share one of the data lines.

A display device is provided, which includes the display panel described above.

A drive method is provided, which is applied to the above pixel circuit, in a case that the at least one pixel sub-circuit each further includes the fourth switch transistor, the drive method includes:

at a first detection period, turning off the first switch transistor and the second switch transistor, and turning on the fourth switch transistor, to charge the storage capacitor by a data line; and at a second detection period, turning on the first switch transistor and the second switch transistor, and turning off the fourth switch transistor, to discharge to the source of the drive transistor by the storage capacitor, and input the reference voltage signal to the gate of the drive transistor.

A drive method is provided, which is applied to the above pixel circuit, in a case that the pixel circuit further includes the third switch transistor, the drive method includes:

at a first detection period, turning off the first switch transistor, the second switch transistor and the third switch transistor, to charge the storage capacitor by a data line;

at a second detection period, turning on the first switch transistor and the second switch transistor, and turning off the third switch transistor, to discharge to the source of the drive transistor by the storage capacitor, and input the reference voltage signal to the gate of the drive transistor; and at a third detection period, turning off the first switch transistor and the second switch transistor, and turning on the third switch transistor, to input the first power supply signal to the light emitting element to control the light emitting element to emit light.

As compared with the conventional technology, the technical solutions according to the present disclosure have the following advantages.

In the drive circuit according to the solution, a switch transistor (the third switch transistor or the fourth switch transistor) is arranged between the first power supply signal and an input terminal (the source) of the drive transistor. When the drive circuit is at the second detection period during which drive current of the light emitting element is detected, the third switch transistor or the fourth switch transistor is controlled to be turned off, such that the first power supply signal is disconnected from the source of the drive transistor. In this case, no current flows through the light emitting element, and therefore the light emitting element does not emit light. When the drive circuit is at the third detection period during which the light emitting element emits light, the third switch transistor or the fourth switch transistor is controlled to be turned on, such that the light emitting unit can emit light under control of the switch transistors. It follows that, with the drive circuit according to the solution, the problem that the light emitting element is lighted and thus it is not dark in the dark state when the drive current of the pixel circuit is detected is solved.

BRIEF DESCRIPTION OF THE DRAWINGS

In order to illustrate technical solutions in embodiments or the conventional technology more clearly, drawings for description of the embodiments or the conventional technology are introduced simply hereinafter. Apparently, the drawings described in the following only describe embodiments. Those skilled in the art may obtain other drawings according to the provided drawings without any creative work.

DETAILED DESCRIPTION OF EMBODIMENTS

Hereinafter technical solutions in embodiments are described clearly and completely in conjunction with drawings in the embodiments. Apparently, the described embodiments are only some rather than all of the embodiments. Any other embodiments obtained based on the embodiments by those skilled in the art without any creative work fall within the scope of protection of the present disclosure.

Figure 1:
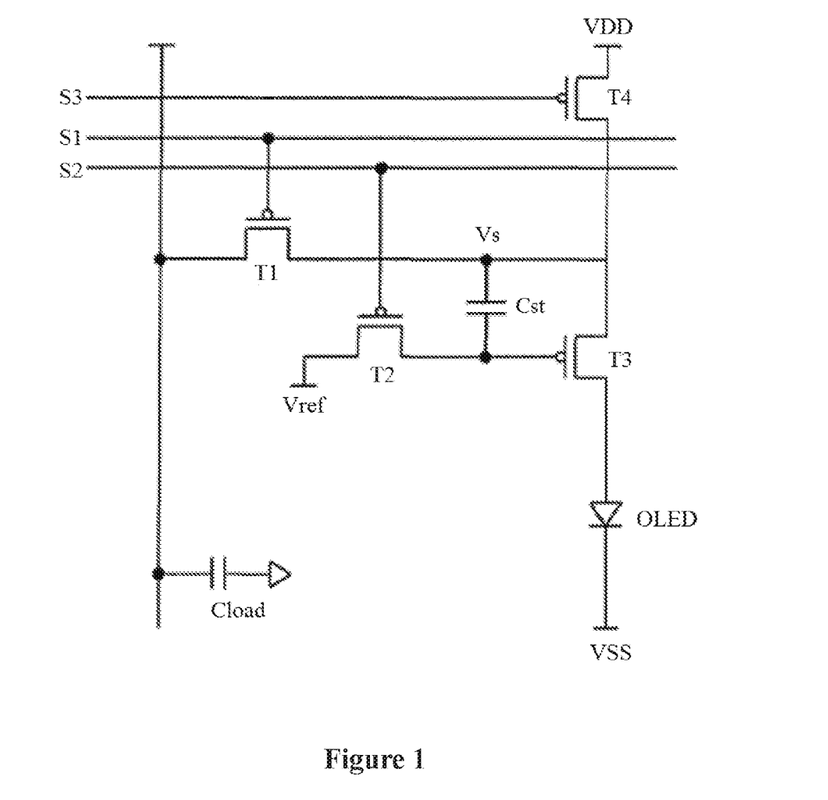
FIG. 1 is a schematic structural diagram of a pixel circuit according to an embodiment in accordance with the disclosure.

Reference is made to FIG. 1 which is a schematic structural diagram of a pixel circuit to which a drive method is applied according to an embodiment in accordance with the disclosure. The pixel circuit includes at least one pixel sub-circuit. The at least one pixel sub-circuit includes: a first switch transistor T1, a second switch transistor T2, a drive transistor T3, a storage capacitor Cload, a light emitting element OLED and a third switch transistor T4.

The components in the pixel circuit are connected in the following manner.

A first electrode of the first switch transistor T1 is connected to a data line, a second electrode of the first switch transistor T1 is connected to a first terminal of a first capacitor Cst, a first electrode of the drive transistor T3 and a first electrode of the third switch transistor T4, and a gate of the first switch transistor T1 is connected to a first scan line S1.

A first electrode of the second switch transistor T2 is connected to a reference voltage signal Vref, a second electrode of the second switch transistor T2 is connected to a second terminal of the first capacitor Cst and a gate of the drive transistor T3, and a gate of the second switch transistor T2 is connected to a second scan line S2.

A second electrode of the drive transistor T3 is connected to an anode of the light emitting element OLED, and a cathode of the light emitting diode OLED is connected to a second power supply signal VSS.

A second electrode of the third switch transistor T4 is connected to a first power supply signal VDD, and a gate of the third switch transistor T4 is connected to a third scan line S3.

The storage capacitor Cload is connected in series between the data line and ground.

According to the above connection relation of the components in the pixel circuit, its circuit principle is as follows.

The first switch transistor T1 is controlled by a first scan signal S1 and is configured to transmit a first data signal (a voltage signal of the storage capacitor Cload) to a source of the drive transistor T3, i.e., Vs shown in FIG. 1. The second switch transistor T2 is controlled by a second scan signal S2 and is configured to transmit a reference voltage signal Vref to the gate of the drive transistor T3. The first capacitor Cst is connected in series between the gate and the source of the drive transistor T3 and is configured to apply a charged voltage of the storage capacitor Cload as a drive voltage of the drive transistor T3 and transmit drive current from the drive transistor T3 to the anode of the light emitting diode OLED. The light emitting element emits light in response to the drive current. The third switch transistor T4 is controlled by a third scan signal S3 and is configured to transmit the first power supply signal VDD to the source of the drive transistor T3.

Figure 2:
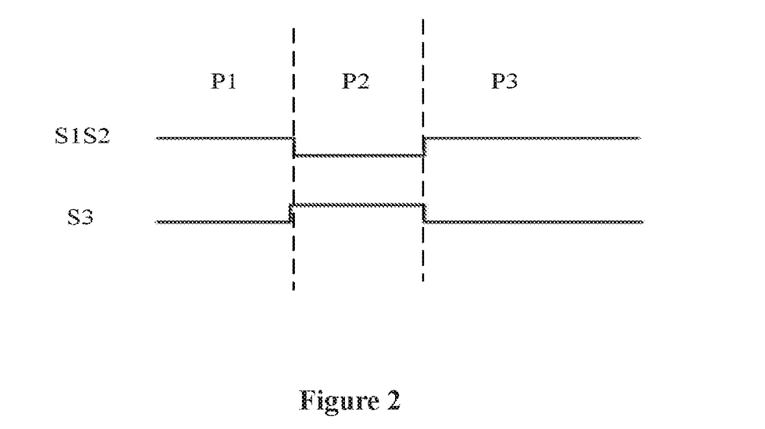
FIG. 2 is a time sequence diagram showing switch control in a drive method of a pixel circuit according to an embodiment of the preset disclosure.

Reference is made to FIG. 2 which shows a control time sequence of switch transistors in a pixel circuit according to an embodiment.

At a first period P1 (a pre-charging period), the first scan signal S1 and the second scan signal S2 are high levels and the third scan signal S3 is a low level. In this case, the first switch transistor T1 and the second switch transistor T2 are turned off, and the storage capacitor Cload is charged by the data line.

At a second period P2 (a drive current detection period), the first scan signal S1 and the second scan signal S2 are low levels and the third san signal S3 is a high level. In this case, the first switch transistor T1 and the second switch transistor T2 are turned on, the storage capacitor Cload discharges to the source of the drive transistor T3 via the first switch transistor T1. Meanwhile, the reference voltage Vref is applied to the gate of the drive transistor. With increase of a voltage of the source of the drive transistor T3, when a gate-to-source voltage Vgs of the drive transistor T3 is less than a threshold voltage Vth of the drive transistor T3, the drive transistor T3 is turned on, the source voltage becomes Vth+Vref and maintains constant. That is, a voltage at a detection point Vs is Vth+Vref at this time. Since a value of the reference voltage Vref is known, the threshold voltage Vth of the drive transistor can be calculated based on the collected voltage at the detection point Vs. An external data driver connected to the drive circuit may compensate the threshold voltage Vth of the drive transistor T3, such that brightness is the same for all pixels, thereby avoiding the problem of non-uniform display brightness and poor homogeneity of the display picture.

In practice, it is found that, at the second period P2 (the drive current detection period), a first power supply signal VDD of the conventional drive circuit is directly connected to the source of the drive transistor T3. Therefore, with increase of the voltage of the source of the drive transistor T3, when the gate-to-source voltage Vgs of the drive transistor T3 is less than the threshold voltage Vth of the drive transistor T3, the drive transistor T3 is turned on. In this case, the first power supply signal VDD is loaded to the anode of the light emitting element OLED via the drive transistor T3, to drive the light emitting element OLED to emit light. However, as described in the background, the drive current of the drive circuit is detected in a dark state of the display panel other than normal display. Therefore the third switch transistor T4 is added in the drive circuit according to the embodiment or the first power supply signal VDD is adjusted to be in a suspension state at the second period.

At the second period P2 (the drive current detection period), since the third scan signal S3 is a high level, the third switch transistor T4 is turned off, such that the first power supply signal VDD is disconnected from the source of the drive transistor T3. In this case, since the first power supply signal VDD is disconnected, the drive transistor T3 can not provide current to the light emitting element OLED, that is, the light emitting element OLED does not emit light certainly in this case. With the drive circuit according to the solution, the light emitting element is ensured to be not lighted when detecting the drive current of the pixel circuit (detecting the threshold voltage Vth of the drive transistor), such that no bright spot appears when the display panel is in the dark state (for example, the screen is in a black-screen state), thereby completely solving the problem that it is not dark in the dark state sometimes in the conventional drive circuit. For example, when the screen is locked, no bright spot appears in the screen, that is, the light emitting element is ensured to be not lighted at the period.

Besides, at the second period P2, the drive circuit according to the embodiment may also control the first power supply signal VDD to be in a suspension state, i.e., the VDD is disconnected to the circuit, or is controlled to be 0. In this case, no current from the first power supply signal VDD is provided to the drive transistor T3, so as to ensure that at the period P2, no current is provided to the light emitting element through the drive transistor T3 in the pixel circuit, and thus the light emitting element OLED does not emit light. Therefore, the display panel is in a dark state (a black-screen state) at the second period P2, and no bright spot appears on the display panel in the dark state.

It should be noted that, in the embodiment, the purpose of setting the first power supply signal VDD to be in the suspension state, is to disconnect the first power supply signal from the source of the drive transistor T3, which plays the same role as controlling the third switch transistor T4 to be turned off. Therefore, the solution of the drive circuit according to the embodiment may be that the third switch transistor is controlled to be turned off while the first power supply signal VDD is controlled to be in the suspension state, thereby achieving dual-disconnection. Alternatively, the solution may be either that the fourth switch transistor is controlled to be turned off or that the first power supply signal VDD is controlled to be in the suspension state, as long as the first power supply signal VDD does not supply power for the light emitting element OLED.

Besides, in the embodiment, at a third period P3, control is performed such that the first scan signal S1 and the second scan signal S2 are high levels and the third scan signal S3 is a low level. In this case, the first switch transistor T1 and the second switch transistor T2 are turned off, the storage capacitor Cload is charged by the data line, and compensated voltage data is inputted. Since the third switch transistor T4 is turned on, the first power supply signal VDD is loaded to the light emitting element OLED via the drive transistor T3 to drive the light emitting element OLED to emit light, thereby achieving a display function of the display panel.

It follows that, in the solution, by controlling the turn-on and turn-off states of the switch transistors, at the period P2, the threshold voltage Vth can be detected, and at the period P3, the threshold voltage Vth of the drive transistor T3 is compensated, to compensate brightness differences between pixels, thereby avoiding the problem of non-uniform display brightness and poor homogeneity of the display picture. Most importantly, at the period P2, the third switch transistor T4 is controlled to be turned off, such that the first power supply signal VDD is disconnected from the light emitting element OLED, and the OLED does not emit light since no electric energy is loaded, thereby meeting a design requirement that the light emitting element OLED does not emit light and the display panel is in the dark state when detecting the drive current of the drive circuit.

Figure 3:
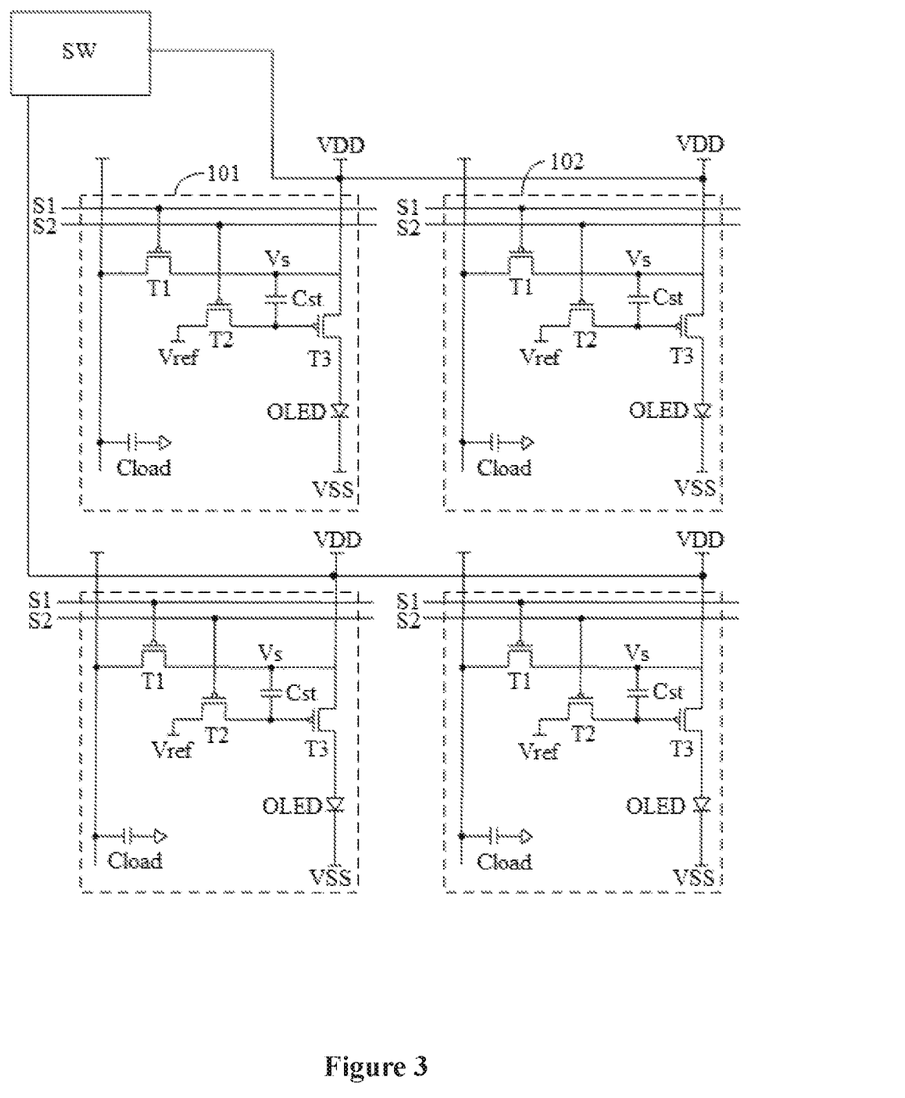
FIG. 3 is a schematic structural diagram of a display panel according to an embodiment in accordance with the disclosure.

Based on the above embodiments, reference is made to FIG. 3 which is a schematic structural diagram of another pixel circuit to which a drive method is applied according to an embodiment. The pixel circuit includes at least one pixel sub-circuit (sub-circuits 101 and 102 having the same circuit structure). The pixel sub-circuit 101 includes: a first switch transistor T1, a second switch transistor T2, a drive transistor T3, a storage capacitor Cload and a light emitting element OLED.

The components in the pixel circuit are connected in the following manner.

A first electrode of the first switch transistor T1 is connected to a data line, a second electrode of the first switch transistor T1 is connected to a first terminal of a first capacitor Cst and a first electrode of the drive transistor T3, and a gate of the first switch transistor T1 is connected to a first scan line S1.

A first electrode of the second switch transistor T2 is connected to a reference voltage signal Vref, a second electrode of the second switch transistor T2 is connected to a second terminal of the first capacitor Cst and a gate of the drive transistor T3, and a gate of the second switch transistor T2 is connected to a second scan line S2.

A second electrode of the drive transistor T3 is connected to an anode of the light emitting element OLED, a cathode of the light emitting element OLED is connected to a second power supply signal VSS, and the storage capacitor Cload is connected in series between the data line and ground.

Besides, a first electrode of a fourth switch transistor SW is connected to the first power signal VDD, a second electrode of the fourth switch transistor SW is connected to a source of the drive transistor T3 and a second electrode of the first switch transistor T1, and a gate of the fourth switch transistor SW receives a fourth scan signal.

It should be noted that, the pixel sub-units in the embodiment have the same circuit structure, and therefore reference may be made one to another. According to the connection relation of the components in the pixel circuit, its circuit principle is as follows.

The first switch transistor T1 is controlled by a first scan signal S1 and is configured to transmit a first data signal (a voltage signal of a storage capacitor Cload) to the source of the drive transistor T3, i.e., Vs shown in FIG. 3. The second switch transistor T2 is controlled by a second scan signal S2 and is configured to transmit a reference voltage signal Vref to a gate of the drive transistor T3. The first capacitor Cst is connected in series between the gate and the source of the drive transistor T3, and is configured to apply a charged voltage of the storage capacitor Cload as a drive voltage of the drive transistor T3 and transmit drive current from the drive transistor T3 to an anode of the light emitting element OLED. The light emitting element emits light in response to the drive current. The fourth switch transistor SW is controlled by the fourth scan signal and is configured to transmit the first power supply signal VDD to the source of the drive transistor T3.

In the embodiment, the fourth switch transistor SW is arranged in a non-display region of a display panel, i.e., outside a region AA. Therefore the fourth switch transistor SW is firstly controlled to be turned off, then threshold detection and compensation are performed on the pixel sub-units, and then the fourth scan signal is controlled to be a low level, such that the fourth switch transistor SW is turned on and to control the light emitting elements to emit light simultaneously.

That is, the pixel sub-units in FIG. 3 are controlled with the following time sequence.

At a first period P1, the first scan signal S1 and the second scan signal S2 are high levels and the third scan signal S3 is a low level. In this case the first switch transistor T1 and the second switch transistor T2 are turned off, and the storage capacitor Cload is charged by a data line.

At a second period P2, the first scan signal S1 and the second scan signal S2 are low levels and the third scan signal S3 is a high level. In this case, the first switch transistor T1 and the second switch transistor T2 are turned on, and the storage capacitor Cload discharges to the source of the drive transistor T3. Meanwhile, the reference voltage Vref is applied to the gate of the drive transistor. Since the fourth scan signal is a high level, the fourth switch transistor SW is turned off, thereby disconnecting the first power supply signal VDD from the source of the drive transistor T3 and preventing writing a voltage signal into the drive transistor T3 by the first power supply signal VDD.

At a third period P3, the first scan signal S1 and the second scan signal S2 are high levels and the third scan signal S3 is a low level. In this case, the first switch transistor T1 and the second switch transistor T2 are turned off, the storage capacitor Cload is charged by the data line, to input compensated voltage data.

At a fourth period P4, the fourth scan signal S4 is controlled to change from a high level to a low level, the fourth switch transistor SW is turned on. In this case, the first power supply signal VDD provides voltage signals to drive transistors T3 in all pixel sub-units, such that the whole display panel emits light.

It should be noted that, in the embodiment, the whole display panel emitting light is beneficial to reducing afterglow of the display screen, reducing persistence of vision, and alleviating dizziness for a user due to smear which is caused by light emitting delay of the light emitting element in the pixel circuit in a frame. Therefore the drive manner in the embodiment is more adaptive to a display control scene of virtual reality (VR) than the drive manner in the above embodiment.

Besides, the pixel sub-circuit according to the embodiment in accordance with the disclosure includes only three transistors and thus has a simple circuit structure, which is beneficial to achieving high PPI (Pixels Per Inch). In addition, in the solution, since the first power supply signals VDD are connected to the light emitting elements OLED of the multiple pixel sub-circuits via the same fourth switch transistor SW, a breadth length ratio of the switch transistor SW needs to be designed according to specific conditions.

Assuming the drive current of the pixel sub-circuit is denoted as I1 and the pixel circuit includes four pixel sub-circuits, current flowing through the fourth switch transistor SW is 4I1 in the whole pixel circuit. According to an equation $I=K*W/L*(Vgs-Vth)^2$, the breadth length ratio W/L is proportional to the current I. Therefore, a value of drive current in a single pixel sub-circuit may be set according to a brightness requirement of the display panel. For example, assuming the drive current for each drive sub-circuit is denoted as 1A, the drive current for the whole pixel circuit is 4A. By substituting 4A into the above equation, a value of the breadth length ratio W/L of the fourth switch transistor SW may be obtained.

In contrast, in the solution that the third switch transistor T4 is provided in each pixel sub-circuit, assuming the drive current of the third switch transistor T4 is denoted as 1A, a value of the breadth length ratio of the third switch transistor T4 may be obtained according to the current calculation equation in a similar way.

Figure 4:
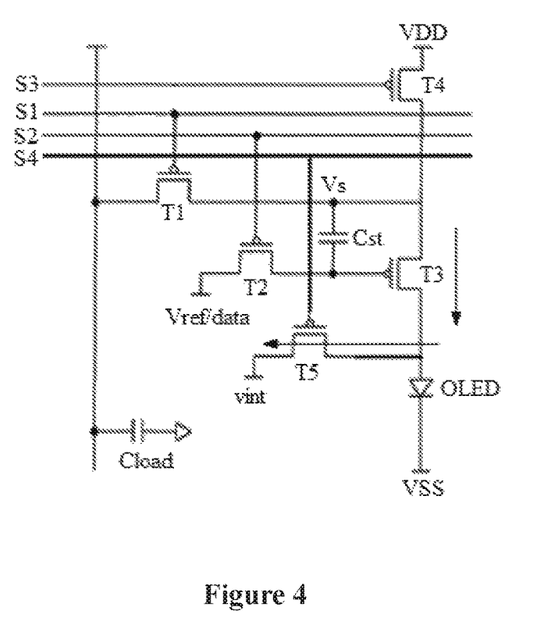
FIG. 4 is a schematic diagram of a current direction of a pixel circuit at a specific period according to an embodiment in accordance with the disclosure.
Figure 5:
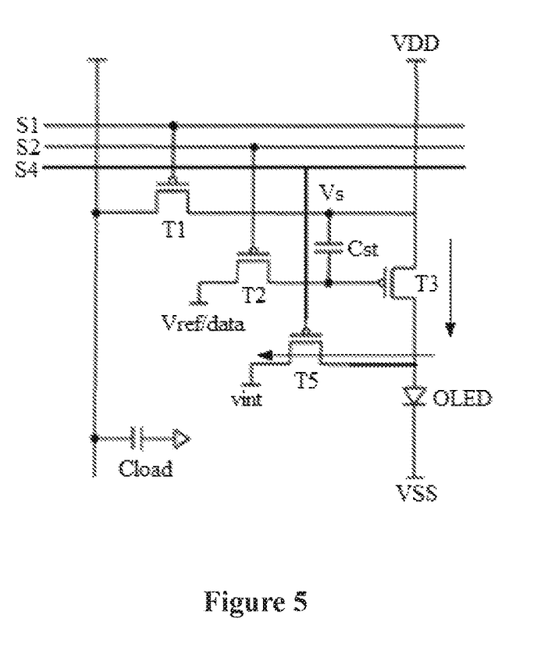
FIG. 5 is a schematic diagram of a current direction of a pixel circuit at another period according to an embodiment in accordance with the disclosure.

Based on the above embodiments, as shown in FIG. 4 and FIG. 5, a pixel circuit according to an embodiment further includes a fifth switch transistor T5.

A first electrode of the fifth switch transistor T5 is connected to a third power supply signal vint, and a second electrode of the fifth switch transistor T5 is connected to an anode of the light emitting element. The fifth switch transistor T5 is controlled by a fifth scan signal S4 and is configured to transmit the third power supply signal vint to the anode of the light emitting element OLED.

Figure 6:
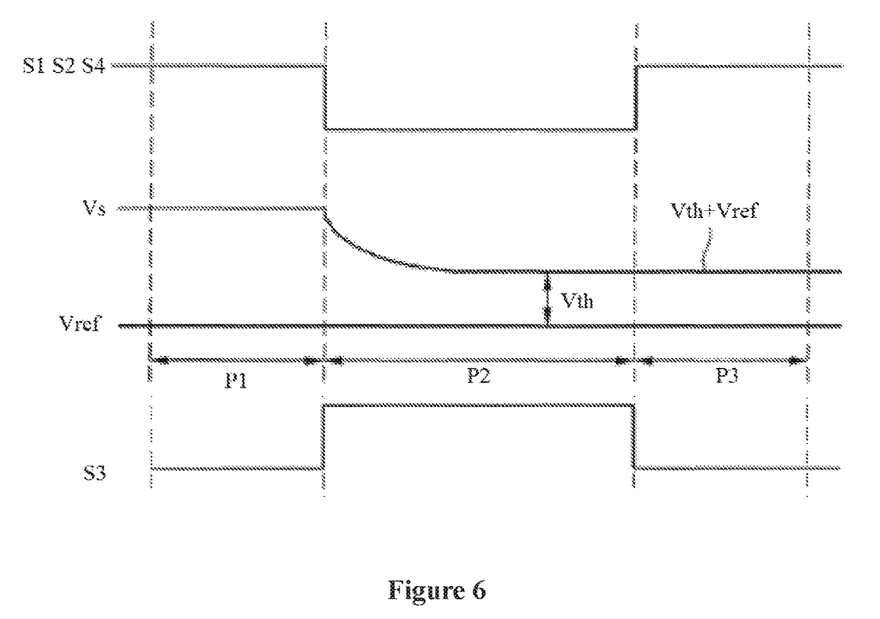
FIG. 6 is a time sequence diagram showing switch control in another drive method of a pixel circuit according to an embodiment in accordance with the disclosure.

As shown in FIG. 6, the purpose of adding the fifth switch transistor T5 in the embodiment is to input the third power supply signal vint to the anode of the light emitting element OLED under the control of the fifth control signal S4 at a threshold detection period P2, thereby resetting the anode of the OLED. The resetting of the anode can solve the problem that, at the threshold detection period, current flows through the drive transistor T3.

This problem may cause the light emitting element OLED to emit light, and thus it is not dark in the dark state of the light emitting element, that is, bright light appears on a conventional display screen when the display screen performs black screen display.

It should be noted that, the detection period for the pixel circuit in the embodiment is the same as that in the above embodiments, which is not repeated here.

Optionally, a potential of the reference voltage signal is higher than a potential of the third power supply signal, i.e., Vref is greater than vint. For example, if Vref=−2, then Vint=−3 and Vss=−3. In this case, it can be ensured that the drive transistor T3 is turned on normally, and is not in a cut-off state due to a voltage difference not meeting an operation condition for the drive transistor. Besides, in the embodiment, each of the first switch transistor, the second switch transistor, the third switch transistor, the fourth switch transistor and the fifth switch transistor is a P-type transistor or an N-type transistor. In the drawings of the present disclosure, the P-type transistor is illustrated as an example.

Figure 7:
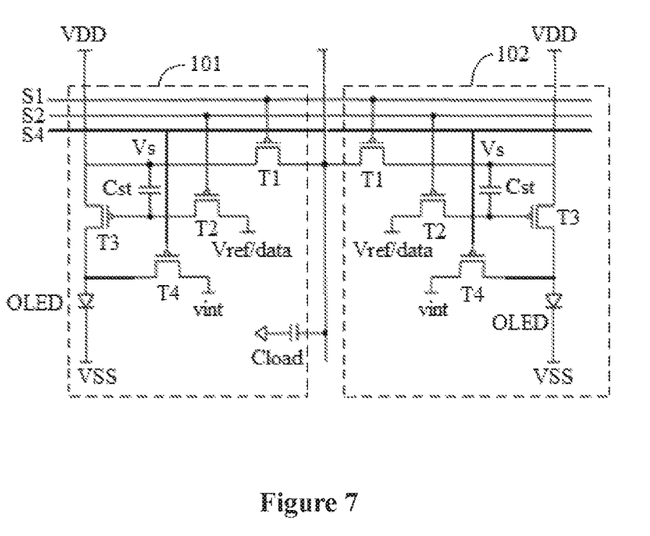
FIG. 7 is a schematic structural diagram of a display panel according to an embodiment in accordance with the disclosure.

As shown in FIG. 7, a display panel is further provided according to an embodiment. The display panel includes: pixel units arranged in an array, multiple data lines, multiple scan lines S1 to S4 and multiple reference lines.

Each of the pixel units includes the pixel circuit according to the above embodiments. The multiple data lines are for providing data signals to the pixel units. The multiple scan lines are for providing scan signals to the pixel units, and the multiple reference lines are for providing reference signals to the pixel units. The display panel according to the embodiment detects current by the drive method in the above embodiments.

Based on the above embodiments, in order to reduce the number of the data lines, two adjacent pixel units in a pixel row direction share one data line in the display panel according to the embodiment. Drains of first switch transistors T1 of a pixel unit 101 and a pixel unit 102 are connected to the data line and are charged through the storage capacitors Cload.

In some embodiments, the two pixel units sharing one data line are located on two sides of the shared data line, and second electrodes of the first switch transistors of the two pixel units are connected to the data line. As shown in FIG. 7, the pixel unit 101 and the pixel unit 102 are located on two sides of the shared data line, and a drain of the first switch transistor T1 in the pixel unit 101 and a drain of the first switch transistor T1 in the pixel unit 102 are connected to the same data line.

Besides, the display panel according to the embodiment may have the configuration that gates of first switch transistors of two pixel units sharing one data line are connected to a first scan line, gates of second switch transistors of the two pixel units sharing one data line are connected to a second scan line, and gates of fourth switch transistors of the two pixel units sharing one data line are connected to a fourth scan line. As shown in FIG. 7, a gate of the first switch transistor T1 in the pixel unit 101 and a gate of the first switch transistor T1 in the pixel unit 102 are connected to a first scan line S1, a gate of a second switch transistor T2 in the pixel unit 101 and a gate of a second switch transistor T2 in the pixel unit 102 are connected to a second scan line S2, and a gate of a fourth switch transistor T4 in the pixel unit 101 and a gate of a fourth switch transistor T4 in the pixel unit 102 are connected to a fourth scan line S4.

Certainly, the above embodiment is only for illustration, and in an embodiment, it may not be limited whether scan lines are shared. For example, the gate of the first switch transistor T1 in the pixel unit 101 is connected to the first scan line S1, the gate of the second switch transistor T2 in the pixel unit 101 is connected to the second scan line S2, and the gate of the fourth switch transistor T4 in the pixel unit 101 is connected to the fourth scan line S4. The gate of the first switch transistor T1 in the pixel unit 102 is connected to a fifth scan line S5, the gate of the second switch transistor T2 in the pixel unit 102 is connected to a sixth scan line S6, and the gate of the fourth switch transistor T4 in the pixel unit 102 is connected to an eighth scan line S8.

In some embodiments, the display panel according to the embodiment further includes a data driver configured to provide a data signal for one of two pixel units sharing one data line while providing data of black or a turn-off voltage for the other of the two pixel units, such that the two pixel units sharing one data line are driven in a time-division manner. That is, the data driver is configured to generate two data signals data1 and data2. When data 1 is a valid data signal, data 2 is data of black or turn-off data, such that the pixel unit 102 is turned off to not operate when the pixel unit 101 operates. When data of data 1 received by the pixel sub-unit 101 is in a drive time sequence in the first embodiment, data of data 2 received by the pixel sub-unit 102 is controlled to be a high level. Since switch transistors in the pixel sub-circuit are PMOS transistors, the switch transistors in the pixel sub-circuit 102 are turned off, that is, the OLED in the pixel sub-circuit 102 does not emit light. Meanwhile, the pixel sub-circuit 101 performs the above drive time sequence, thereby controlling light emitting of the OLED and performing threshold detection and compensation on the drive transistor.

Similarly, control may be performed such that data 1 is data of black and data 2 is valid data. Sharing the data line may reduce the number of the data lines, thereby reducing a cost of the whole pixel circuit.

It should be noted that, in the embodiment, each of the drive transistor T3, the first switch transistor T1, the second switch transistor T2 and the fourth transistor T4 is an N-type transistor, or a P-type transistor, which is not limited in the embodiment.

A display device is further provided according to an embodiment, which includes the display panel described above.

In summary, a pixel circuit, a drive method, a display panel and a display device are provided according to the solution. The switch transistor is arranged between the first power supply signal and an input terminal (the source) of the drive transistor. When the drive circuit is at a second detection period during which drive current of the light emitting element is detected, the switch transistor is controlled to be turned off, such that the first power supply signal is disconnected from the source of the drive transistor. In this case, no current flows through the light emitting element, and therefore the light emitting element does not emit light, thereby solving the problem in the conventional technology that the light emitting element is lighted and it is not dark in the dark state when the drive current of the pixel circuit is detected.

Various embodiments of the specification are described in a progressive manner, and each embodiment emphasizes differences from other embodiments. For the same or similar parts between the embodiments, one may refer to the description of other embodiments. The above illustration of the disclosed embodiments can enable those skilled in the art to implement or use the present disclosure. Many changes for the embodiments are obvious for those skilled in the art. General principles defined herein may be implemented in other embodiments without departing from the spirit or scope of the present disclosure. Therefore, the present disclosure is not limited by the embodiments disclosed herein, but is to conform to the widest scope in accordance with principles and novel features disclosed herein.

The invention claimed is:
1. A pixel circuit, comprising
at least one pixel sub-circuit, wherein
the at least one pixel sub-circuit comprises a first switch transistor, a second switch transistor, a drive transistor, a storage capacitor and a light emitting element, wherein the first switch transistor is controlled by a first scan signal and is configured to transmit a first data signal to a source of the drive transistor, the second switch transistor is controlled by a second scan signal and is configured to transmit a reference voltage signal to a gate of the drive transistor, the storage capacitor is connected in series between the gate and the source of the drive transistor and is configured to apply a charged voltage as a drive voltage of the drive transistor;

the source of the drive transistor is electrically connected to a first power supply signal, and a drain of the drive transistor is connected to an anode of the light emitting element and is configured to transmit drive current from the drive transistor to the anode of the light emitting element; and a cathode of the light emitting element is connected to a second power supply signal, and the light emitting element emits light in response to the driving current, and wherein the pixel circuit further comprises a third switch transistor, and the third switch transistor is controlled by a third scan signal and is configured to transmit the first power supply signal to the source of the drive transistor, wherein at a first detection period, the first switch transistor, the second switch transistor and the third switch transistor are turned off, to charge the storage capacitor by a data line; at a second detection period, the first switch transistor and the second switch transistor are turned on, and the third switch transistor is turned off, to discharging to the source of the drive transistor by the storage capacitor, and input the reference voltage signal to the gate of the drive transistor; and at a third detection period, the first switch transistor and the second switch transistor are turned off, and the third switch transistor is turned on, to input the first power supply signal to the light emitting element to control the light emitting element to emit light; or the at least one pixel sub-circuit each further comprises a fourth switch transistor, and the fourth switch transistor is controlled by a fourth scan signal and is configured to transmit the first power supply signal to the source of the drive transistor, wherein at a first detection period, the first switch transistor and the second switch transistor are turned off, and the fourth switch transistor is turned on, to charge the storage capacitor by a data line; and at a second detection period, the first switch transistor and the second switch transistor are turned on, and the fourth switch transistor are turned off, to discharge to the source of the drive transistor by the storage capacitor, and input the reference voltage signal to the gate of the drive transistor.

2. The pixel circuit according to claim 1, wherein in a case that the pixel circuit further comprises the third switch transistor, a first electrode of the third switch transistor is connected to the first power supply signal, a second electrode of the third switch transistor is connected to a source of each drive transistor and a first electrode of each first switch transistor, and a gate of the third switch transistor receives the third scan signal.

3. The pixel circuit according to claim 1, wherein in a case that the at least one pixel sub-circuit each further comprises a fourth switch transistor, a first electrode of the fourth switch transistor is connected to the first power supply signal, a second electrode of the fourth switch transistor is connected to the source of the drive transistor and a first electrode of the first switch transistor, and a gate of the fourth switch transistor receives the fourth scan signal.

4. The pixel circuit according to claim 1, further comprising a fifth switch transistor, wherein a first electrode of the fifth switch transistor is connected to a third power supply signal, a second electrode of the fifth switch transistor is connected to the anode of the light emitting element, the fifth switch transistor is controlled by a fifth scan signal and is configured to transmit the third power supply signal to the anode of the light emitting element.

5. The pixel circuit according to claim 4, wherein a potential of the reference voltage signal is higher than a potential of the third power supply signal.

6. The pixel circuit according to claim 4, wherein each of the first switch transistor, the second switch transistor, the third switch transistor, the fourth switch transistor and the fifth switch transistor is a P-type transistor or an N-type transistor.

7. The pixel circuit according to claim 1, wherein the light emitting element is an organic light emitting diode.

8. A display panel, comprising:
pixel units arranged in an array;
a plurality of data lines for providing data signals for the pixel units;
a plurality of scan lines for providing scan signals for the pixel units; and
a plurality of reference lines for providing reference signals for the pixel units, wherein
each of the pixel units comprises a pixel circuit comprising at least one pixel sub-circuit, wherein
the at least one pixel sub-circuit comprises a first switch transistor, a second switch transistor, a drive transistor, a storage capacitor and a light emitting element,
the first switch transistor is controlled by a first scan signal and is configured to transmit a first data signal to a source of the drive transistor,
the second switch transistor is controlled by a second scan signal and is configured to transmit a reference voltage signal to a gate of the drive transistor,
the storage capacitor is connected in series between the gate and the source of the drive transistor and is configured to apply a charged voltage as a drive voltage of the drive transistor;
the source of the drive transistor is electrically connected to a first power supply signal, and a drain of the drive transistor is connected to an anode of the light emitting element and is configured to transmit drive current from the drive transistor to the anode of the light emitting element; and
a cathode of the light emitting element is connected to a second power supply signal, and the light emitting element emits light in response to the driving current, and wherein
the pixel circuit further comprises a third switch transistor, and the third switch transistor is controlled by a third scan signal and is configured to transmit the first power supply signal to the source of the drive transistor, wherein at a first detection period, the first switch transistor, the second switch transistor and the third switch transistor are turned off, to charge the storage capacitor by a data line; at a second detection period, the first switch transistor and the second switch transistor are turned on, and the third switch transistor is turned off, to discharge to the source of the drive transistor by the storage capacitor, and input the reference voltage signal to the gate of the drive transistor; and at a third detection period, the first switch transistor and the second switch transistor are turned off, and the third switch transistor is turned on, to input the first power supply signal to the light emitting element to control the light emitting element to emit light; or the at least one pixel sub-circuit each further comprises a fourth switch transistor, and the fourth switch transistor is controlled by a fourth scan signal and is configured to transmit the first power supply signal to the source of the drive transistor, wherein at a first detection period, the first switch transistor and the second switch transistor are turned off, and the fourth switch transistor is turned on, to charge the storage capacitor by a data line; and at a second detection period, the first switch transistor and the second switch transistor are turned on, and the fourth switch transistor are turned off, to discharge to the source of the drive transistor by the storage capacitor, and input the reference voltage signal to the gate of the drive transistor;

the scan lines are parallel to a pixel row direction;

the data lines are parallel to a pixel column direction; and in the pixel row direction, two adjacent pixel units of the pixel units share one of the data lines.

9. The display panel according to claim 8, wherein in a case that the pixel circuit further comprises the third switch transistor, a first electrode of the third switch transistor is connected to the first power supply signal, a second electrode of the third switch transistor is connected to a source of each drive transistor and a first electrode of each first switch transistor, and a gate of the third switch transistor receives the third scan signal.

10. The display panel according to claim 8, wherein in a case that the at least one pixel sub-circuit each further comprises a fourth switch transistor, a first electrode of the fourth switch transistor is connected to the first power supply signal, a second electrode of the fourth switch transistor is connected to the source of the drive transistor and a first electrode of the first switch transistor, and a gate of the fourth switch transistor receives the fourth scan signal.

11. The display panel according to claim 8, wherein the pixel circuit further comprises a fifth switch transistor, wherein a first electrode of the fifth switch transistor is connected to a third power supply signal, a second electrode of the fifth switch transistor is connected to the anode of the light emitting element, the fifth switch transistor is controlled by a fifth scan signal and is configured to transmit the third power supply signal to the anode of the light emitting element.

12. The display panel according to claim 11, wherein a potential of the reference voltage signal is higher than a potential of the third power supply signal.

13. The pixel circuit according to claim 11, wherein each of the first switch transistor, the second switch transistor, the third switch transistor, the fourth switch transistor and the fifth switch transistor is a P-type transistor or an N-type transistor.

14. The pixel circuit according to claim 8, wherein the light emitting element is an organic light emitting diode.

15. The display panel according to claim 8, wherein the two adjacent pixel units sharing one of the data lines are located on two sides of the shared data line, and second electrodes of the first switch transistors of the two pixel units are connected to the data line.

16. The display panel according to claim 15, wherein gates of the first switch transistors of the two pixel units sharing one of the data lines are connected to a first scan line, gates of the second switch transistors of the two pixel units sharing one of the data lines are connected to a second scan line, and gates of the fourth switch transistors of the two pixel units sharing one of the data lines are connected to a fourth scan line.

17. The display panel according to claim 16, further comprising a data driver, wherein the data driver is configured to provide a data signal for one of the two pixel units sharing one of the data lines while providing data of black or a turn-off voltage for the other of the two pixel units, to drive the two pixel units sharing one of the data lines in a time-division manner.

* * * * *